United States Patent [19]
Schmitt

[11] Patent Number: 5,890,602
[45] Date of Patent: Apr. 6, 1999

[54] DEMONSTRATIVE PACKAGING FOR RACK MOUNT HARDWARE

[75] Inventor: Ty R. Schmitt, Round Rock, Tex.

[73] Assignee: Dell USA, L.P., Round Rock, Tex.

[21] Appl. No.: 883,975

[22] Filed: Jun. 27, 1997

[51] Int. Cl.$^6$ .................................................. A47F 5/00
[52] U.S. Cl. ........................ 211/13.1; 211/26; 211/189; 40/538
[58] Field of Search ........................... 211/26, 189, 191, 211/13.1; 40/538; 206/457, 459.5

[56] References Cited

U.S. PATENT DOCUMENTS

| | | | |
|---|---|---|---|
| 5,050,326 | 9/1991 | Munsey | 40/538 |
| 5,165,770 | 11/1992 | Hahn | 211/26 X |
| 5,209,356 | 5/1993 | Chaffee | 211/26 |
| 5,312,005 | 5/1994 | Odell | 211/26 X |
| 5,571,256 | 11/1996 | Good et al. | 211/26 |
| 5,624,044 | 4/1997 | Black | 211/189 X |
| 5,791,498 | 8/1998 | Mills | 211/26 |

*Primary Examiner*—Robert W. Gibson, Jr.
*Attorney, Agent, or Firm*—Skjerven, Morrill, MacPherson, Franklin & Friel, L.L.P.; Marc R. Ascolese

[57] ABSTRACT

A demonstrative package for rack mounted electronic equipment enclosure hardware includes a package corresponding to the size and shape of an electronic equipment enclosure that is to be mounted in a rack and mounting hardware attached to the package. The mounting hardware is attached to the package in a location on the package corresponding to where the hardware is attached to the electronic equipment enclosure, thereby providing a clear example of how an enclosure or component is supposed to be mounted into a rack. The demonstrative package can be attached to a rack.

16 Claims, 3 Drawing Sheets

DEMONSTRATIVE PACKAGING FOR RACK MOUNT HARDWARE

BACKGROUND OF THE INVENTION

1. Field of the Invention

This invention relates to electronic equipment enclosures, particularly, computer equipment enclosures, and more specifically to packaging and distributing hardware to mount computer equipment enclosures in a rack.

2. Description of the Related Art

A rack is a compartment that can contain a number of electronic equipment or computer equipment enclosures. Electronic equipment enclosures include, for example, disk system enclosures that are capable of receiving disk drives, and electronic components that contain electronic equipment within the enclosure, such as computer systems and redundant array of inexpensive disk (RAID) systems. Electronic components and a rack for mounting the electronic components can be selected by a user and purchased from a single source, or a user may choose electronic components with the intention of mounting them in a rack already owned by the user or a rack to be acquired from another source. In either case, rack mounting an electronic component usually requires a hardware kit which can include rails, slides, angled sheetmetal brackets, retractable cable arms, and miscellaneous hardware (e.g. screws).

In the case where the user selects a rack and electronic components at the same time, it is desirable to install as much mounting hardware into the rack as possible to decrease the amount of additional packaging required to ship the hardware. Installing as much mounting hardware as possible is also desirable because it minimizes the amount of hardware that must be installed by the user. However, with many components only a limited amount of the required hardware can be pre-mounted into the rack without mounting the actual component. In this situation, all other hardware must be placed into a kit and shipped to the user with instructions that show how the hardware is to be mounted to the component and how it is to be mounted to the rack.

If the user already owns a rack, or intends to acquire a rack from a source other than the source of the electronic components, the user must purchase a rack kit in order to attach the component to the rack. In this case, none of the mounting hardware can be pre-mounted to the rack, and the rack kit must include instructions for the installation of all of the mounting hardware to both the component and the rack.

Thus, in either of the situations above, clearly presenting assembly instructions that show how the equipment is to be assembled is important as some or all of the mounting hardware is distributed to and installed by the user.

Present assembly instructions use written and pictorial directions, or provide video and/or software to explain to the user how to assemble the rack hardware. Additionally, when the rack and components are selected together, hardware kits are shipped separately from the equipment rack because the hardware cannot be installed without installing the components.

SUMMARY OF THE INVENTION

It has been discovered that providing a demonstrative package which corresponds to the size of an electronic equipment enclosure and which includes mounting hardware which is attached to the package to demonstrate where the hardware is actually mounted provides a user with a clear example of how an electronic equipment enclosure or electronic component is supposed to be mounted into a rack before the user must mount the enclosure or component. Using such a demonstrative package, one can ship the demonstrative package already mounted in the rack that will be used to mount an electronic equipment enclosure, thereby installing as much hardware into the rack as possible and decreasing the number of packages that must be shipped.

Accordingly, one aspect of the present invention provides a demonstrative package for rack mounted electronic equipment enclosure hardware. The demonstrative package includes a package corresponding to the size and shape of an electronic equipment enclosure that is to be mounted in a rack. The demonstrative package also includes mounting hardware attached to the package. The mounting hardware is attached to the package in a location on the package so as to correspond to where the hardware is attached to the electronic equipment enclosure.

In another aspect of the invention, an electronic equipment rack mounting system includes an electronic equipment rack and a demonstrative package for mounted electronic equipment enclosure hardware. The demonstrative package is attached to the rack. The demonstrative package further includes a package corresponding to the size and shape of an electronic equipment enclosure that is to be mounted in the rack. Also, mounting hardware is attached to the package. The mounting hardware is attached to the package in a location on the package so as to correspond to where the hardware is attached to the electronic equipment enclosure.

In another aspect of the invention, a method of packaging hardware for rack mounted electronic equipment enclosures is disclosed. A demonstrative package is provided. The demonstrative package corresponds to a size and shape of an electronic equipment enclosure to be mounted in a rack. Mounting hardware is attached to the package in a location so as to correspond to where the hardware is attached to the electronic equipment enclosure.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

Figure 1:
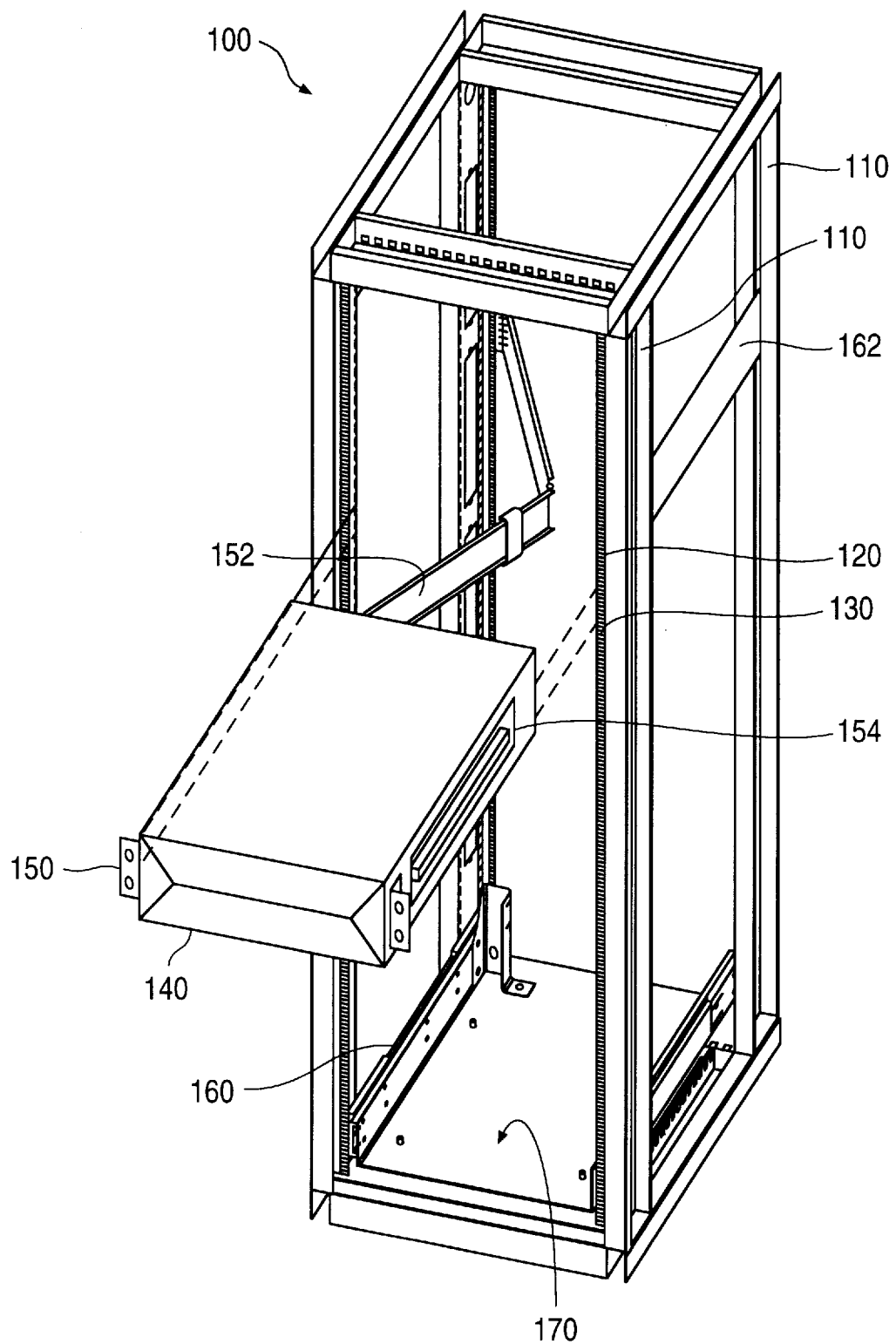
FIG. 1 is a perspective view of an electronic equipment rack mounting system of the present invention including a demonstrative package.

An electronic equipment rack mounting system of the present invention is shown in FIG. 1. Rack 100 includes vertical members 110 that provide vertical support to the rack. Attached to these vertical members are vertical rails 120 that include a plurality of mounting holes 130 for attaching mounting hardware and electronic equipment enclosures, including electronic components such as computer systems and RAID systems to the rack 100. Demonstrative package 140 includes mounting hardware 150, 152, and 154 that is attached to the demonstrative package, thereby allowing the demonstrative package to be mounted into the rack 100. Demonstrative package 140 has dimensions comparable to those of the electronic equipment enclosure or component that the mounting hardware will be used to attach to the rack. Consequently, from the location and manner in which the mounting hardware is attached to the package, a user can clearly see how to attach the mounting hardware to the appropriate electronic equipment enclosure.

In this embodiment, the mounting hardware includes two angled mounting brackets 150, with holes such that the demonstrative package can be mounted to the rack using fasteners to secure the package to vertical rails 120. Mounting brackets 150 are attached to the demonstrative package in a matter suitable for both the hardware and the package material. For example, if the package is made of material that is sufficiently thick and rigid, mounting brackets 150 are attached to the package using threaded fasteners, such as screws, that are in turn used to attach the mounting brackets to an electronic equipment enclosure that will later be mounted in the rack. Additionally, cable arm 152 and rails 154 attach to the demonstrative package in a matter suitable for both the hardware and the package material. Slide 162 is shown mounted in rack 100. A similar slide is mounted on the opposite side of the rack (not shown). When the demonstrative package is installed in the rack, rails 154 can be attached to slide 162 and to the slide on the opposite side of the rack.

The electronic equipment rack mounting system is shown with additional mounting hardware mounted in rack 100, including horizontal slides 160 and equipment trolley 170. Horizontal slides 160 are attached to vertical rails 120 using fasteners. Equipment trolley 170 is attached to horizontal slides 160 so that the trolley can slide in and out of the rack. Slides 160 and trolley 170 are examples of mounting hardware that can be mounted into rack 100 at the time the rack is first assembled, and need not be mounted in the rack by the user.

Figure 2:
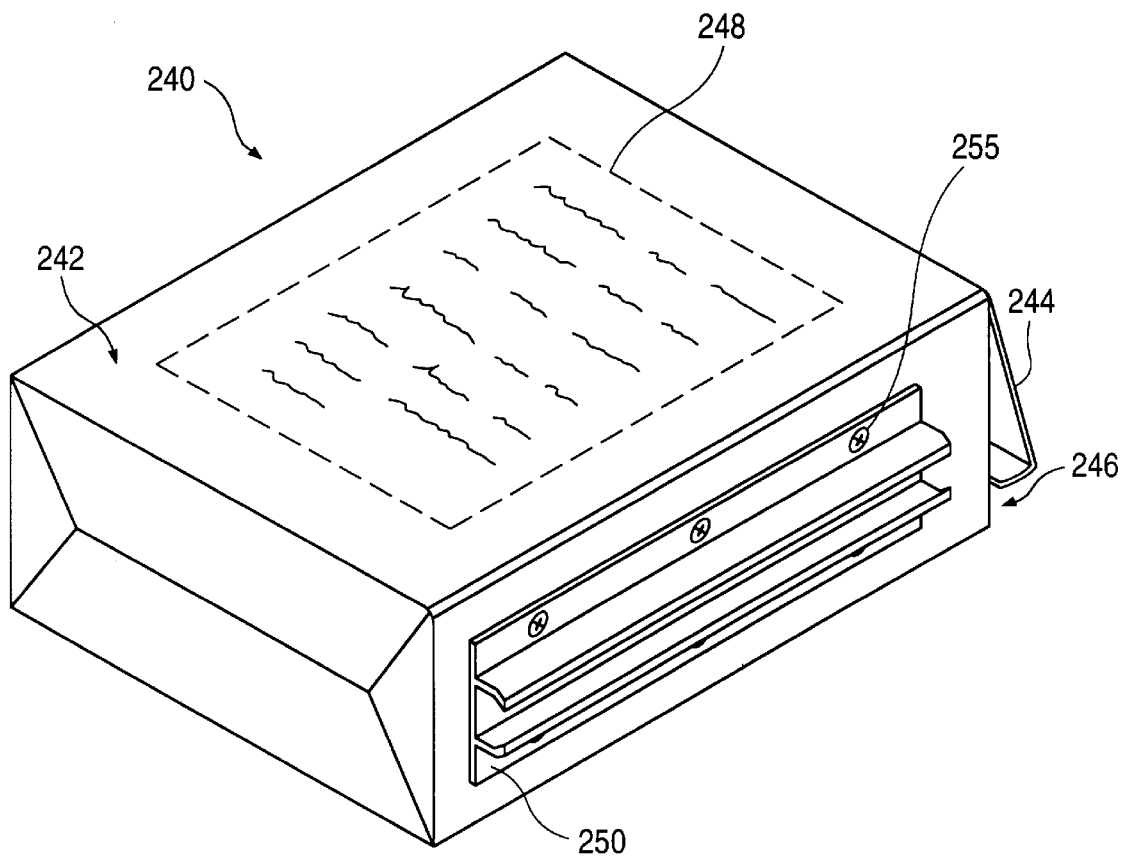
FIG. 2 is an alternate embodiment of the demonstrative package of the present invention.

FIG. 2 illustrates a perspective view of an alternate embodiment of the demonstrative package of the present invention. Demonstrative package 240 is a cardboard box corresponding in size and shape to an electronic equipment enclosure that is to be mounted in a rack (e.g., rack 100 of FIG. 1). Demonstrative package 240 has a first outside surface 242, for example the top surface of the box. The first outside surface has instructions 248 printed thereon. These instructions can include both written instructions and diagrams that provide the user with further information about attaching the mounting hardware to the electronic equipment enclosure and about attaching the enclosure to the rack. Demonstrative package 240 also includes a flap 244 that, when opened, allows access to the interior 246 of the package 240. The interior of the package retains additional pieces of mounting hardware, such as screws or bolts, and other electronic enclosure related items including cables, software, manuals, or additional instructions. Track 250 is mounting hardware that is attached to the demonstrative package in a location on the package that corresponds to the track which is attached to the electronic equipment enclosure. Track 250 is attached to the demonstrative package with screws 255. Screws 255 also attach the track to the appropriate electronic equipment enclosure. Since demonstrative package 240 is constructed from a cardboard box, the package can be designed to be collapsible for easy storage both before and after use.

Figure 3:
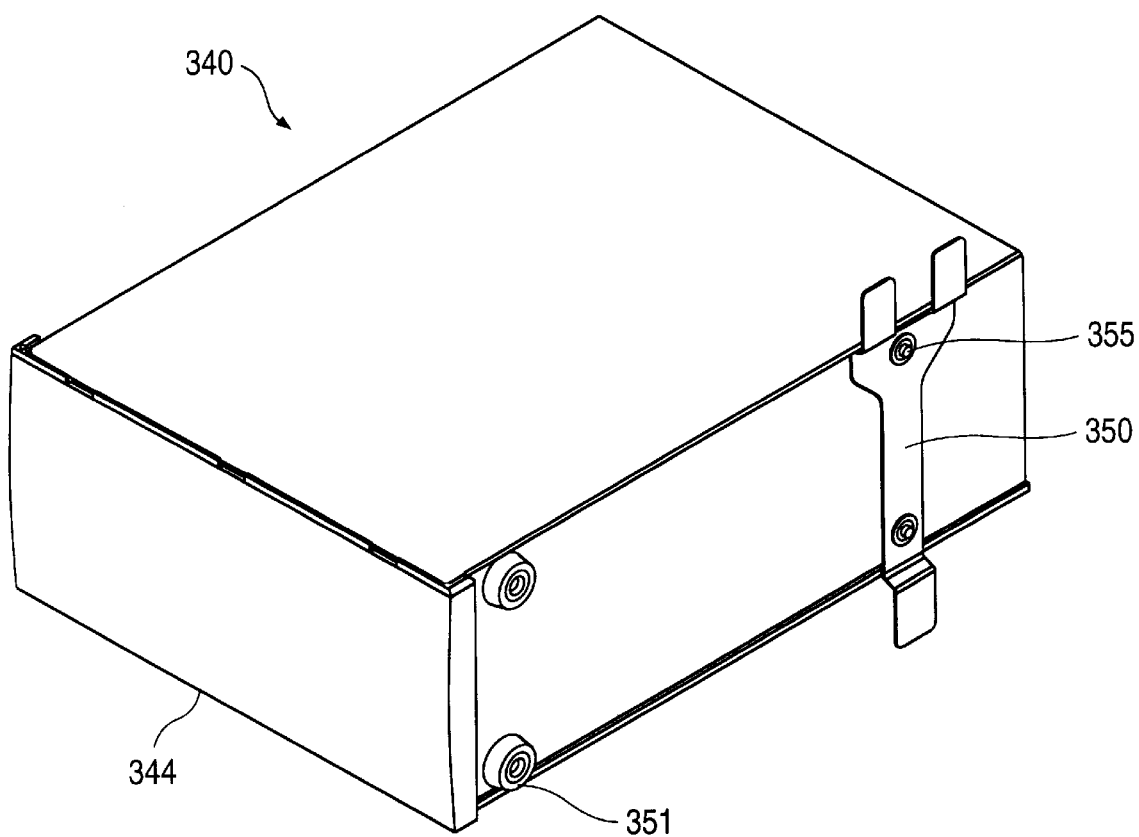
FIG. 3 is an alternate embodiment of the demonstrative package of the present invention.

A perspective view of an alternate embodiment of the demonstrative package is shown in FIG. 3. Demonstrative package 340 is a plastic box corresponding in size and shape to an electronic equipment enclosure that is to be mounted in a rack like rack 100 of FIG. 1. Demonstrative package 340 has a removable lid 344 which allows access to the interior of the package. Stabilizing bracket 350 and spacers 351 are attached to the demonstrative package so as to demonstrate where they should be attached on the appropriate electronic equipment enclosure. Stabilizing bracket 350 is attached to demonstrative package 340 with bolts 355 and nuts (not shown). Spacers 351 are attached to the package with an adhesive compound (not shown).

Other embodiments are within the following claims. For example, while the above embodiments of the demonstrative package are generally formed from rectangular boxes, the demonstrative package can take any size or shape as appropriate. Also for example, the demonstrative package need not have an accessible interior. Additionally, the demonstrative package can be constructed from a variety of materials including cardboard, wood, plastic, and foam. A variety of different mounting hardware can be attached to the package, including rails, slides, tracks, angled sheetmetal brackets, retractable cable arms, and the chassis retaining system described in United States patent application Ser. No. 08/881,544 (R. Steven Mills and Steven L. Sands, "Chassis Retaining System for an Electronics Rack". Additionally, a variety of different fasteners can be used to attach mounting hardware to the demonstrative package, including screws, bolts, tabs, clips and adhesives.

The description of the invention set forth herein is illustrative and is not intended to limit the scope of the invention as set forth in the following claims. Variations and modifications of the embodiments disclosed herein may be made based on the description set forth herein, without departing from the scope and spirit of the invention as set forth in the following claims.

What is claimed is:

1. A demonstrative package for rack mounted electronic equipment enclosure hardware comprising:
   a package corresponding to a size and shape of an electronic equipment enclosure to be mounted in a rack; and
   mounting hardware attached to the package, the mounting hardware being attached to the package in a location on the package so as to correspond to where the hardware is attached to the electronic equipment enclosure.

2. The demonstrative package of claim 1, wherein the package includes:
   a box for containing additional enclosure related items, the box having a first outside surface; and
   instructions printed on the first outside surface, the instructions describing attaching the mounting hardware to the electronic equipment enclosure and to a rack.

3. The demonstrative package of claim 2, further comprising attaching hardware, the attaching hardware attaching the mounting hardware to the package.

4. The demonstrative package of claim 3, wherein the attaching hardware comprises fasteners.

5. The demonstrative package of claim 1 wherein the package is constructed from a material selected from cardboard, wood, foam, and plastic.

6. The demonstrative package of claim 1 wherein the package is collapsible.

7. An electronic equipment rack mounting system comprising:
   an electronic equipment rack; and
   a demonstrative package for mounted electronic equipment enclosure hardware including:
      a package corresponding to a size and shape of an electronic equipment enclosure to be mounted in the rack; and mounting hardware attached to the package, the mounting hardware being attached to the package in a location on the package so as to correspond to where the hardware is attached to the electronic equipment enclosure;

the demonstrative package being attached to the electronic equipment rack.

8. The electronic equipment rack mounting system of claim 7, wherein the package includes:

a box for containing additional enclosure related items, the box having a first outside surface; and instructions printed on the first outside surface, the instructions describing attaching the mounting hardware to the electronic equipment enclosure and to the rack.

9. The electronic equipment rack mounting system of claim 8, further comprising attaching hardware, the attaching hardware attaching the mounting hardware to the package.

10. The electronic equipment rack mounting system of claim 9, wherein the attaching hardware comprises fasteners.

11. The electronic equipment rack mounting system of claim 7 wherein the package is constructed from a material selected from cardboard, wood, foam, and plastic.

12. The electronic equipment rack mounting system of claim 7 wherein the package is collapsible.

13. The electronic equipment rack mounting system of claim 7 further comprising an electronic component attached to the electronic equipment rack.

14. A method of packaging hardware for rack mounted electronic equipment enclosures comprising the steps of:

providing a demonstrative package corresponding to a size and shape of an electronic equipment enclosure to be mounted in a rack; and attaching mounting hardware to the package in a location corresponding to where the hardware is attached to the electronic equipment enclosure.

15. The method of claim 14 wherein the demonstrative package is a box for containing additional enclosure related items and having a first outside surface, further comprising the steps of:

printing instructions on the first outside surface, the instructions describing attaching the mounting hardware to the electronic equipment enclosure and to a rack; and locating additional enclosure related items inside the box.

16. The method of claim 15 further comprising the step of mounting the demonstrative package in a rack.

* * * * *